US009945960B2

(12) United States Patent
Hartman et al.

(10) Patent No.: US 9,945,960 B2
(45) Date of Patent: Apr. 17, 2018

(54) LUMINAIRE ASSOCIATE

(71) Applicant: GENERAL ELECTRIC COMPANY, Schenectady, NY (US)

(72) Inventors: Michael James Hartman, Clifton Park, NY (US); Bruce Gordon Barnett, Troy, NY (US); John Erik Hershey, Ballston Lake, NY (US); Michael Joseph Dell'Anno, Clifton Park, NY (US); Stanislava Soro, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/337,582

(22) Filed: Oct. 28, 2016

(65) Prior Publication Data

US 2017/0045626 A1    Feb. 16, 2017

Related U.S. Application Data

(63) Continuation of application No. 14/543,892, filed on Nov. 18, 2014, now Pat. No. 9,622,323.

(Continued)

(51) Int. Cl.
*G08B 3/00* (2006.01)
*G01S 19/47* (2010.01)
(Continued)

(52) U.S. Cl.
CPC ............... *G01S 19/47* (2013.01); *F21S 8/085* (2013.01); *G01P 15/18* (2013.01); *G01R 22/06* (2013.01); *G01S 11/06* (2013.01); *G01S 19/14* (2013.01); *G08B 21/18* (2013.01); *G08G 1/087* (2013.01); *H02J 7/0052* (2013.01); *H04W 4/046* (2013.01);
(Continued)

(58) Field of Classification Search
CPC . G01S 19/14; G07C 9/00158; H05B 37/0227; B05B 19/418
USPC .......... 340/12.5, 539.1, 870.07, 539.13, 669, 340/686.1, 689; 362/233; 315/312, 152, 315/294; 455/405, 445
See application file for complete search history.

(56) References Cited

U.S. PATENT DOCUMENTS 6,308,134 B1 * 10/2001 Croyle .................. G01C 21/16
                                                           340/990
7,305,714 B2 * 12/2007 Hamaguchi ............. G06F 21/88
                                                           340/545.5
(Continued)

FOREIGN PATENT DOCUMENTS

CN          101418933 A       4/2009
CN          102287675 A       12/2011
(Continued)

OTHER PUBLICATIONS

Chapman et al. "Pulse Compression", Radar Systems Analysis and Design Using MATLAB, pp. 1-37, 2000.
(Continued)

*Primary Examiner* — Hoi Lau
(74) *Attorney, Agent, or Firm* — Pabitra K. Chakrabarti

(57) ABSTRACT

A street lighting fixture and street lamp used in street lighting containing an accelerometer that is used to detect and characterize acceleration events on a street lighting fixture. The accelerometer readings may be combined with GPS technology to determine a relocation of the street lighting fixture.

3 Claims, 12 Drawing Sheets

Related U.S. Application Data

(60) Provisional application No. 61/907,090, filed on Nov. 21, 2013, provisional application No. 61/907,078, filed on Nov. 21, 2013, provisional application No. 61/907,069, filed on Nov. 21, 2013, provisional application No. 61/907,114, filed on Nov. 21, 2013, provisional application No. 61/907,133, filed on Nov. 21, 2013, provisional application No. 61/907,150, filed on Nov. 21, 2013, provisional application No. 61/907,168, filed on Nov. 21, 2013, provisional application No. 61/907,188, filed on Nov. 21, 2013, provisional application No. 61/907,210, filed on Nov. 21, 2013.

(51) Int. Cl.

| | | |
|---|---|---|
| H05B 37/02 | (2006.01) | |
| G01S 11/06 | (2006.01) | |
| G08G 1/087 | (2006.01) | |
| H04W 4/04 | (2009.01) | |
| G01R 22/06 | (2006.01) | |
| G01P 15/18 | (2013.01) | |
| G08B 21/18 | (2006.01) | |
| F21S 8/08 | (2006.01) | |
| G01S 19/14 | (2010.01) | |
| H02J 7/00 | (2006.01) | |
| F21W 131/103 | (2006.01) | |
| G01S 11/02 | (2010.01) | |
| F21V 33/00 | (2006.01) | |
| G01S 11/12 | (2006.01) | |
| H02J 7/34 | (2006.01) | |

(52) U.S. Cl.
CPC ..... *H05B 37/0227* (2013.01); *H05B 37/0263* (2013.01); *H05B 37/0272* (2013.01); *F21V 33/00* (2013.01); *F21W 2131/103* (2013.01); *G01S 11/02* (2013.01); *G01S 11/12* (2013.01); *H02J 7/345* (2013.01); *Y02B 20/72* (2013.01)

(56) References Cited

U.S. PATENT DOCUMENTS

| | | | | |
|---|---|---|---|---|
| 7,667,686 | B2* | 2/2010 | Suh | G06F 1/1616 340/573.1 |
| 7,843,327 | B1* | 11/2010 | DiMartino | G08B 13/1409 340/505 |
| 7,853,268 | B2* | 12/2010 | Karaoguz | H04W 4/02 340/572.1 |
| 8,115,625 | B2* | 2/2012 | Yoshioka | G08B 21/0233 340/539.1 |
| 8,195,422 | B2 | 6/2012 | Wilcox et al. | |
| 8,840,569 | B2* | 9/2014 | Flaction | A61B 5/224 340/573.1 |
| 9,439,269 | B2* | 9/2016 | Hartman | G08G 1/087 |
| 9,560,720 | B2* | 1/2017 | Hartman | G08G 1/087 |
| 9,621,265 | B2* | 4/2017 | Hartman | H04B 10/1129 |
| 9,622,323 | B2* | 4/2017 | Hartman | H05B 37/0227 |
| 9,622,324 | B2* | 4/2017 | Hartman | H05B 37/0227 |
| 9,646,495 | B2* | 5/2017 | Barnett | G08G 1/048 |
| 9,712,234 | B1* | 7/2017 | Zhang | H04B 10/116 |
| 2003/0048499 | A1 | 3/2003 | Alfano et al. | |
| 2003/0122708 | A1* | 7/2003 | Percy | G01S 5/0027 342/357.52 |
| 2003/0174051 | A1* | 9/2003 | Naitou | B60R 25/102 340/426.1 |
| 2006/0178817 | A1* | 8/2006 | Suzuki | G01C 21/20 701/420 |
| 2007/0085699 | A1* | 4/2007 | Walters | G06Q 30/04 340/870.02 |
| 2007/0222581 | A1* | 9/2007 | Hawkins | G06Q 20/127 340/539.1 |
| 2008/0218366 | A1* | 9/2008 | Chen | G01P 15/00 340/669 |
| 2009/0033504 | A1* | 2/2009 | Tsai | G08B 3/10 340/584 |
| 2009/0109059 | A1* | 4/2009 | Mizuno | G01C 21/3694 340/905 |
| 2009/0128328 | A1* | 5/2009 | Fan | G08B 25/08 340/541 |
| 2009/0164174 | A1* | 6/2009 | Bears | G01D 4/00 702/188 |
| 2009/0167508 | A1* | 7/2009 | Fadell | G06F 3/016 340/407.2 |
| 2010/0013608 | A1* | 1/2010 | Petrisor | G01S 19/14 340/12.32 |
| 2010/0029268 | A1* | 2/2010 | Myer | F21S 2/00 455/426.1 |
| 2010/0148696 | A1 | 6/2010 | Pabst | |
| 2010/0188243 | A1* | 7/2010 | Tysowski | G08B 21/24 340/669 |
| 2010/0289663 | A1* | 11/2010 | Savchenko | B60Q 5/008 340/688 |
| 2010/0309209 | A1* | 12/2010 | Hodgins | G06T 13/40 345/473 |
| 2011/0070898 | A1* | 3/2011 | Sanjeev | H04W 4/028 455/456.2 |
| 2011/0106487 | A1* | 5/2011 | Kourogi | G01C 21/26 702/142 |
| 2011/0156900 | A1* | 6/2011 | Toda | H04N 5/772 340/539.13 |
| 2011/0215736 | A1* | 9/2011 | Horbst | G05B 19/418 315/297 |
| 2012/0062414 | A1* | 3/2012 | Sambongi | G01C 21/165 342/357.25 |
| 2012/0086560 | A1* | 4/2012 | Ilyes | H05B 37/0227 340/12.5 |
| 2012/0086561 | A1* | 4/2012 | Ilyes | H05B 37/0227 340/12.32 |
| 2012/0139774 | A1 | 6/2012 | Nagy | |
| 2012/0230696 | A1* | 9/2012 | Pederson | G07C 9/00158 398/115 |
| 2012/0280825 | A1* | 11/2012 | Sakakihara | G01C 21/08 340/686.1 |
| 2012/0299721 | A1* | 11/2012 | Jones | B60R 25/33 340/521 |
| 2012/0299755 | A1* | 11/2012 | Jones | G08B 13/1436 340/990 |
| 2013/0057158 | A1* | 3/2013 | Josefowicz | G01S 19/14 315/152 |
| 2013/0076523 | A1* | 3/2013 | Kwan | A61B 5/0022 340/686.6 |
| 2013/0173455 | A1* | 7/2013 | Adams | H04B 5/00 705/39 |
| 2013/0181609 | A1* | 7/2013 | Agrawal | H05B 37/03 315/131 |
| 2013/0217414 | A1* | 8/2013 | Nagaraj | H04W 84/005 455/456.2 |
| 2013/0244686 | A1* | 9/2013 | Saha | G06F 1/3206 455/456.1 |
| 2013/0346229 | A1* | 12/2013 | Martin | G06Q 40/00 705/26.3 |
| 2014/0070986 | A1* | 3/2014 | Gao | G01C 21/165 342/357.3 |
| 2014/0085055 | A1* | 3/2014 | Lee | G06Q 10/06 340/10.5 |
| 2014/0094136 | A1* | 4/2014 | Huang | H04W 4/02 455/404.2 |
| 2014/0125250 | A1* | 5/2014 | Wilbur | H01Q 1/44 315/297 |
| 2014/0171126 | A1* | 6/2014 | Mayor | G01S 5/14 455/456.6 |
| 2014/0191858 | A1* | 7/2014 | Morgan | G07C 5/0816 340/439 |
| 2015/0137684 | A1* | 5/2015 | Hartman | H05B 37/034 315/120 |
| 2015/0137703 | A1* | 5/2015 | Hartman | G08G 1/087 315/294 |

(56) References Cited

U.S. PATENT DOCUMENTS

| | | | | |
|---|---|---|---|---|
| 2015/0138000 A1* | 5/2015 | Hartman | ............... | G08G 1/087 340/906 |
| 2015/0141044 A1* | 5/2015 | Hartman | ............... | G08G 1/087 455/456.1 |
| 2015/0142359 A1* | 5/2015 | Hartman | ............... | G08G 1/087 702/79 |
| 2015/0147064 A1* | 5/2015 | Hartman | ............ | H05B 37/0272 398/106 |
| 2015/0173159 A1* | 6/2015 | Lin | ........................ | G01W 1/00 315/120 |
| 2015/0319825 A1* | 11/2015 | Destine | ............. | H05B 37/0227 315/153 |
| 2015/0339919 A1* | 11/2015 | Barnett | ............... | G08G 1/0116 340/907 |
| 2015/0346320 A1* | 12/2015 | Hartman | ............ | H05B 37/0227 315/312 |
| 2016/0094088 A1* | 3/2016 | Bjorn | ..................... | H02J 9/061 315/161 |
| 2016/0095182 A1* | 3/2016 | Bjorn | ................ | H05B 37/0218 315/149 |
| 2016/0113092 A1* | 4/2016 | Hartman | ............... | G08G 1/087 340/686.1 |
| 2016/0174039 A1* | 6/2016 | Huang | ................. | H04W 4/023 455/456.3 |
| 2017/0045626 A1* | 2/2017 | Hartman | ............... | G08G 1/087 |
| 2017/0104531 A1* | 4/2017 | Aggarwal | ............ | H04B 10/116 |
| 2017/0104532 A1* | 4/2017 | Stout | .................... | H04B 10/116 |
| 2017/0142809 A1* | 5/2017 | Paolini | .............. | H05B 37/0272 |
| 2017/0170899 A1* | 6/2017 | Breuer | ................ | H04B 10/116 |
| 2017/0187456 A1* | 6/2017 | Siessegger | ......... | H04W 64/006 |

FOREIGN PATENT DOCUMENTS

| | | |
|---|---|---|
| CN | 102355764 A | 2/2012 |
| CN | 102854500 A | 1/2013 |
| CN | 102933979 A | 2/2013 |
| EP | 0961134 A1 | 12/1999 |

OTHER PUBLICATIONS

Li-Qing et al. "Positioning System for Freight Vehicle Based on RFID Technology", Computing Technology and Automation, vol. No. 30, Issue No. 1, pp. 39-44, Mar. 2011.

Fernandes et al. "Power Line Communication in Energy Markets", Cypress, Published in Industrial Control DesignLine, pp. 1-15, Aug. 2011.

Jing et al. "Research on GPS /RFID Integration Algorithm Based on the Optimal Selection of RFID Observations", Journal of National University of Defense Technology, vol. No. 34, Issue No. 2, pp. 70-75, Apr. 2012.

Unofficial English Translation of Chinese Office Action issued in connection with related CN Application No. 201480073800.4 dated Apr. 21, 2017.

U.S. Non-Final Office Action issued in connection with related U.S. Appl. No. 14/546,408 dated May 11, 2017.

Unofficial English Translation of Chinese Office Action issued in connection with related CN Application No. 201480073799.5 dated May 24, 2017.

Unofficial English Translation of Chinese Office Action issued in connection with related CN Application No. 201480073816.5 dated Jun. 2, 2017.

Unofficial English Translation of Chinese Office Action issued in connection with related CN Application No. 201480073801.9 dated Jun. 2, 2017.

European Search Report and Opinion issued in connection with related EP Application No. 14863951.1 dated Jun. 7, 2017.

European Search Report and Opinion issued in connection with related EP Application No. 14863466.0 dated Jun. 14, 2017.

Chinese Office Action issued in connection with reiated CN application No. 201480073798.0 dated Jun. 21, 2017.

European Search Report issued in connection with related EP application No. 14863718.4 dated Jun. 28, 2017.

European Search Report issued in connection with related EP application No. 148637119 dated Jul. 3,2017.

European Search Report issued in connection with related EP application No. 14864958.5 dated Jul. 26, 2017.

* cited by examiner roadway

LUMINAIRE ASSOCIATE

This application is a non-provisional of and claims the benefit of U.S. Provisional Patent Application Ser. Nos. 61/907,069, 61/907,078, 61/907,090, 61/907,114, 61/907,133, 61/907,150, 61/907,168, 61/907,188 and 61/907,210 filed on Nov. 21, 2013, the entire contents of which are incorporated herein by reference. Further, this application is a Continuation Application of commonly assigned, U.S. patent application Ser. No. 14/543,892, entitled "LUMINAIRE ASSOCIATE", filed on Nov. 18, 2014, the contents of which are hereby incorporated by reference in their entirety.

BACKGROUND

Area and street lighting is one of the most important elements of a city's infrastructure. For such extensive lighting installations it is desirable to know the locations of individual luminaires for maintenance and other purposes involving planning and billing. In many instances, maintenance and installation crews installing luminaires record the luminaire locations by their GPS coordinates. The GPS coordinates are often provided by GPS receivers carried by the installation crews as part of a crew's personal data assistant. It occasionally happens that luminaires are moved and their new location coordinates are not recorded. This introduces bookkeeping errors and increases the city's overhead in maintaining the lighting infrastructure. It may also result in incorrectly locating and therefore misinterpreting data provided by non-illumination functions that are associated with, and physically proximate to, the luminaire.

It is also desirable for infrastructure managers to know if and when a luminaire has received a substantial physical shock so that the luminaire may be examined for damage and also to have a record of the time and characterization of the event for summarizing the facts of the incident causing the physical shock.

A need therefore exists for a luminaire associate that will report and record physical shocks and their characteristics and also alert infrastructure management to its relocation.

SUMMARY

A device, method, and system for a street lighting fixture to assess an acceleration event impacting the street lighting fixture and further to determine if there has been a relocation of the street lighting fixture.

BRIEF DESCRIPTION OF THE DRAWINGS

One or more exemplary embodiments are set forth in the following detailed description and the drawings, in which.

DETAILED DESCRIPTION

Figure 1:
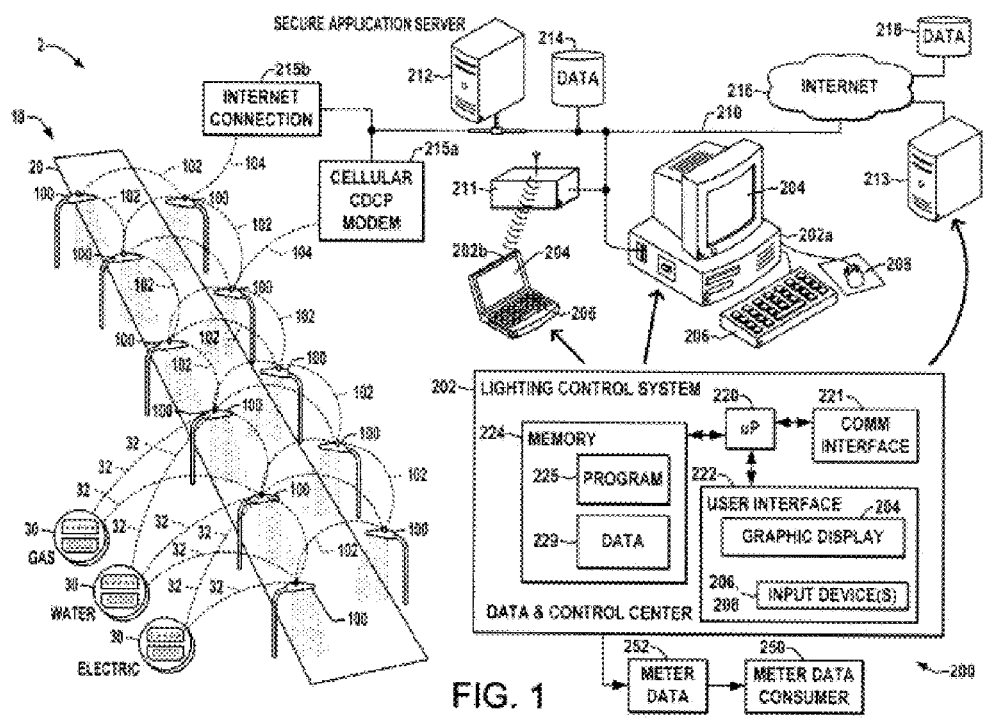
FIG. 1 is a system diagram illustrating an exemplary outdoor lighting system according to one embodiment.

Referring now to the drawings, like reference numerals are used in the figures to refer to like elements throughout, and the various features are not necessarily drawn to scale. The present disclosure relates to outdoor lighting systems and methods in which RF and/or PLC-enabled outdoor lighting fixtures form one or more networks for control and/or monitoring by a lighting control system of a general purpose network, with the control system able to obtain data from one or more utility meters by communications through a general purpose network and the lighting system network. The disclosed embodiments may be advantageously employed to facilitate utility meter reading without requiring manual reading of residential or commercial/industrial meters or localized wireless readings obtained from vehicles traversing local streets. Instead, utilities and other meter data consumers can obtain meter information via lighting control systems that control and/or monitor outdoor lighting fixtures via RF mesh networks and/or PLC-based local networks, with the lighting control system obtaining the meter data by communications through the general purpose network and the lighting system network. This usage of the outdoor lighting infrastructure as a conduit for utility meter information may thus save vast resources of utility companies in staffing manual meter reading operations and/or the expense of constructing and maintaining dedicated network infrastructures.

Figure 2:
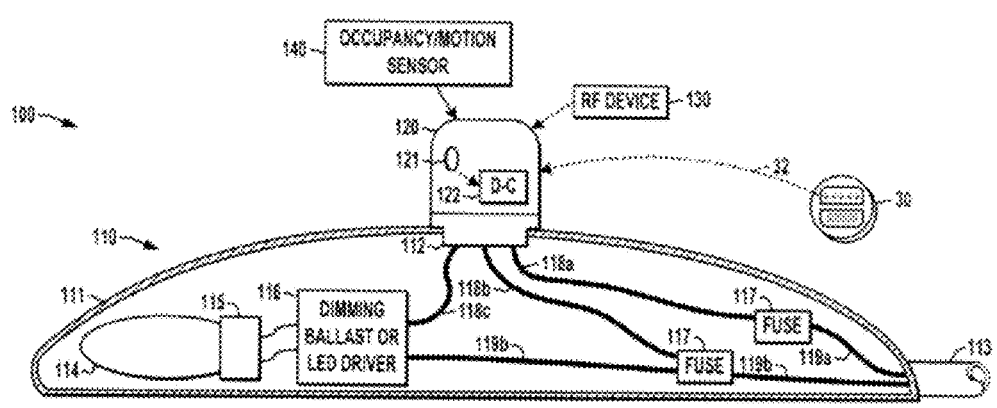
FIG. 2 is a partial sectional side elevation view illustrating an exemplary dimmable outdoor lighting fixture apparatus with a controller module according to one embodiment.
Figure 3:
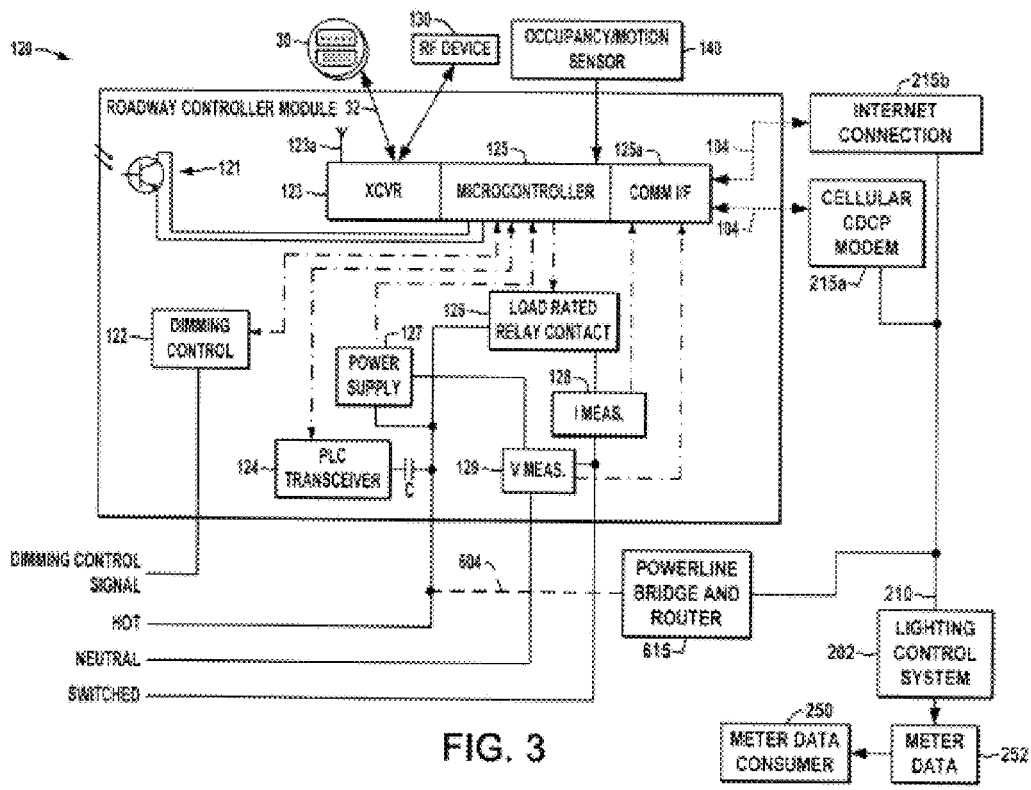
FIG. 3 is a schematic diagram illustrating further details of the controller module in the outdoor lighting fixture apparatus of FIG. 2.
Figure 4:
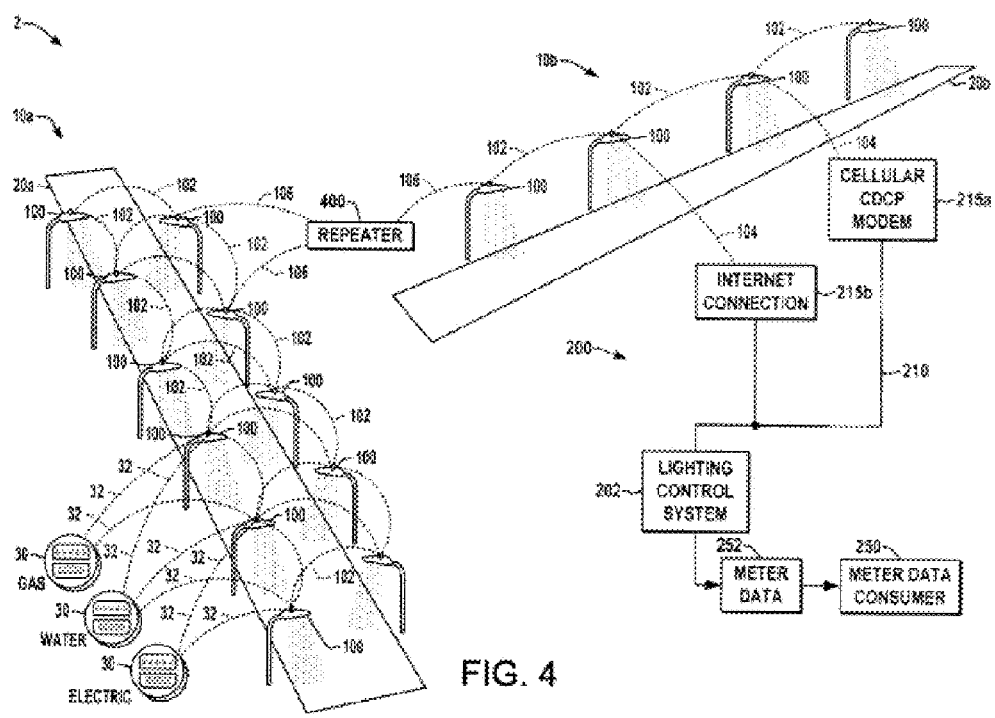
FIG. 4 is another system diagram showing an exemplary outdoor lighting system with multiple a mesh network portions interconnected by a repeater with one portion bridged to a general purpose network system according to one embodiment.

Referring initially to FIGS. 1-4, FIG. 1 depicts an exemplary outdoor lighting system 2 with RF-enabled outdoor lighting fixtures 100 forming an RF mesh network 10 for communication between some or all fixtures 100 proximate a roadway or street 20, where the mesh network 10 is formed via one or more individual RF communications connections or links 102 between fixtures 100 that are within range of one another. The links 102 may be continuous or discontinuous, with the network 10 being an ad-hoc self-healing network. The fixtures 100 in certain embodiments are individually addressable, such that each is capable of identifying a message and relaying received messages to other fixtures within the network 10, whereby two fixtures 100 can communication with one another through one or more intervening fixtures 100, even though they are not directly within RF range of each other. As shown in FIG. 4, moreover, the RF-enabled outdoor lighting fixtures 100 may establish RF mesh network connections 102 to form multiple mesh network portions with repeaters 400 bridging the portions. For example, FIG. 4 shows a first RF mesh network 10*a* and a second RF mesh network 10*b*, with a repeater 400 providing communications interfacing between the networks 10*a*, 10*b*. Moreover, one or more of the RF-enabled outdoor lighting fixtures 100 is operative to communicate by RF signaling with at least one RF-enabled utility meter 30, such as RF-enabled gas meters 30, water meters 30, electric power meters 30, for example.

The RF mesh network 10 is bridged with a lighting control system 202 of a general purpose network system 200 using any suitable bridging apparatus. In the examples of FIGS. 1-4, a bridging component 215 provides communications interfacing between the RF mesh network 10 and a general purpose network 210 of a network system 200. In certain embodiments, the bridging component is a modem, such as a pole-mounted Central Data Collection Point (CDCP) modem 215*a* operatively coupled to one of the fixtures 100 of the RF mesh network 10 to provide communications interfacing between the RF mesh network 10 and the general purpose network 210. In other embodiments, a pole-mounted Internet connection bridging component 215*b* provides an Internet connection to one of the RF-enabled outdoor lighting fixtures 100 of the RF mesh network 10 and interfaces communications between the networks 10 and 210.

The control system 202 is operative to obtain meter data 252 from one or more RF-enabled utility meters 30 by communications through the general purpose network 210 and the lighting system RF network 10. The control system 202 can then provide the meter data 252 to one or more meter data consumers 250, such as utility companies, municipalities, companies, etc. In operation, the lighting control system 202 is operatively coupled with the general purpose network 210 by any suitable network interconnections, direct and/or indirect, including wired and/or wireless interconnections for transferring signaling and/or messaging. The system 202 further operates to control or monitor at least one of the RF-enabled outdoor lighting fixtures 100, in addition to obtaining data from the RF-enabled utility meter(s) 30 via communications through the general purpose network 210, the bridging component 215, and the RF mesh network 10.

In certain embodiments, the RF mesh network 10 uses a ZigBee wireless protocol, although other suitable communications protocols can be used. Moreover, the fixtures 100 may be operative according to different protocols, for example, using a first protocol (e.g., ZigBee) to communicate with other fixtures in the mesh network 10, and may also employ a second protocol to communicate with utility meters 30. In certain embodiments, the lighting control system 202 can instruct one or more of the lighting fixtures 100 to switch to a second protocol for contacting one or more meters 30 to obtain readings or other data therefrom, after which the fixture 100 will revert to the first protocol to relay the obtained meter data 252 back to the controller 202 via the RF mesh network 10, any intervening router(s) 400, the bridging component 215, and the general purpose network 210.

The wireless interface of the individual fixtures 100 may act as a router and retransmit received messages that are not destined for that particular fixture 100, thereby facilitating establishment and operation of the mesh network 10. Additionally, if a message is destined for the ballast control unit, the message may be relayed to the control module and the command therein used to control the dimmable ballasts and/or the light outputs. Other devices may be coupled with the mesh network 10 beyond the illustrated outdoor lighting fixtures 100, meters 30, repeaters 400, and bridging components 215, for example, external RF-enabled occupancy/motion sensors 140, external RF transmitters and/or receivers 130, and other like devices. For example, the mesh network 10 in certain embodiments may include a coordinator unit, such as a single coordinator per mesh network 10 (e.g., 1 for network portion 10*a* and another for portion 10*b* in FIG. 4). Upon initiating any network device, the fixture 100 registers with the coordinator unit using a unique id. In the case of the outdoor fixtures 100, registration may include messages notifying the coordinator unit of the capabilities of the fixture, for example, how many dimmable driver/ballasts 116 and light sources 114 and other fixture parameters, such as current dimming programs, profiles, or their control parameters, and/or diagnostic information.

The coordinator may coordinate the fixtures 100 with any other network devices and with one another. For example, the coordinator may send messages to the fixture 100 containing commands operative to control dimmable ballasts 116 and the light outputs thereof. The coordinator unit may act based upon internal stimuli, such as an internal clock or timer, or external stimuli, such as an event triggered by a network device or a user, for instance, based on commands received from the lighting control system 202. For example, a coordinator unit may instruct the fixture 100 to power on light outputs at a certain time or to power on light outputs in response to motion sensed by a motion sensor device 140. The coordinator may be a dedicated network device or can be integrated with another network device having additional functions. For example, a light fixture 100 or a bridging device 215, or a motion sensor 140 may act as the coordinator unit in addition to its above described functionality. Additionally, not every network device within the mesh network 10 need necessarily act as a router.

As shown in FIG. 1, the general purpose network system 200 may be a single or multiple network architecture providing a processing environment in which one or more aspects of the present disclosure may be practiced. The system 200 may include one or more processor-based lighting control systems 202 implemented in a networked computing environment. In the example of FIG. 1, a desktop computer 202*a* and a portable computer 202*b* are communicatively coupled with a network 210, each of which includes a graphical display 204 and one or more input devices, such as a keyboard 206, a mouse or other pointing device 208, microphones for speech commands, or other user input devices (not shown), where the portable computer 202*b* is coupled with the network 210 via a wireless transceiver 211. The network 210, in turn, may be communicatively connected with other networks, such as internet 216 providing operative access between the computers 202 and one or more of a network server 212, a network database 214, and/or an internet data store 218 and a further server 213. In this regard, one or both of the data stores 214, 218, and/or the servers 212, 213 or the computers 202 may store meter data 252 desired by a meter data consumer 250 to provide a unitary or distributed secure database, where such storage may also be used for lighting control data or other information related to outdoor lighting systems being operated and monitored by the lighting control system 202.

The presently disclosed systems and methods may be implemented in certain embodiments using one or more software program components operating or otherwise executed by a microprocessor or other processing element (e.g. microprocessor 220 in the processor-based system 202, microcontroller 125 in the lighting fixture control modules 120 as shown in FIG. 3, etc.). As best shown in FIG. 1, the processor-based lighting control system 202 can be implemented in whole or in part in a network server 212, in one or both of the computers 202, and/or in combination thereof. The control system 202 may include a microprocessor or other processing element 220, a communication interface 221 that operatively interconnects the processor-based system 202 with the network 210, as well as a memory 224, a graphical user interface 222 providing a graphic display 204 and one or more input devices such as the illustrated computer keyboard and/or mouse 206, 208. The memory 224 in this example may include data 229 and computer readable program code 225 with instructions executable by the processor 220 to implement the functionality described herein, where the system 202 may operate on a unitary data set, and/or the data may be implemented in distributed storage fashion with storage of portions in the processor-based system 202, the network server 212, and/or in one or more internet based data stores 213, 214, 218.

The system 202 may be operatively interconnected (e.g., via the network 210) with one or more bridging components 215, such as a wireless network via a Cellular CDPD modem or other wireless interface 215a or an internet connection 215b providing data exchange and other communication by and between one or more devices of the mesh network system 10 such as the light fixtures 100, and/or the meters 30 such that the processor-based lighting control system 202 receives data from and/or provides data to the devices 140, 100, 30. The processing element 220 in these embodiments may execute a program to implement a data and control center system to allow gathering of meter data 252 from one or more of the meters 30 that are communicatively coupled (continuously or intermittently) with the mesh network 10. A given meter 30 may be read using an RF connection between with one of the RF-enabled lighting fixtures 100 of the mesh network 10 as shown in FIG. 1 and/or using a powerline connection 604 (PLC-based) with one or more PLC-enabled fixtures 100 of an outdoor lighting network.

FIGS. 2 and 3 show further details of an exemplary outdoor lighting fixture apparatus 100 including a horizontal luminaire fixture assembly 110 with a fixture housing structure 111 having an inlet conduit 113 for receiving power wiring. The fixture housing 111 may be mounted to a building or to a pole or other support structure for a particular outdoor lighting application. One or more light sources 114 are supported in the fixture housing 111 via sockets 115, such as incandescent lamps, fluorescent lamps, high intensity discharge (HID) lamps, LEDs or arrays thereof, etc. The light source(s) 114 is driven by a ballast or driver 116, also supported in the housing 111. In certain embodiments a twist-lock receptacle 112 may be mounted to the top of the fixture housing 111 for connection of a controller module 120. The controller module 120 may include a photo sensor 121 operative to sense ambient light near the fixture assembly 110 for controlling turn on and turn off timing in certain embodiments. The twist-lock connector and the receptacle 112 provide electrical connection via wires 118a, 118b and 118c, with two input wires 119a and 119b routed into the housing 111 via the conduit 113, which may optionally be terminated at fuses 117. In one example, a first phase (line) wire 118a connects the power line from the first fuse 117 to a first receptacle terminal and a second phase wire 118b connects the power neutral to the second terminal, with the neutral also being connected from the second fuse 117 to the driver or ballast 116 via wire 119b. The power line is selectively switched by the controller module 120 and provided to the ballast or driver 116 via a switched line wire 118c, such that the ballast or driver 116 is selectively powered or unpowered by the operation of the controller 120 which may include a load rated relay contact 126 (FIG. 3) operative according to a switch control signal from the microcontroller 125 of the controller module 120 to selectively couple the incoming line connection 118a with the switched power line 118c. A dimming control signal may be introduced in certain embodiments from a dimming control/command component 122 to within the fixture housing 111 (FIG. 2) through a modification of the twist-lock socket 112, such as by including a fourth and/or fifth conductor to convey this signal to the dimming ballast or driver 116 within the housing 111.

FIG. 3 illustrates a controller module 120 that includes a dimming component (dimming command component) 122. The dimming component may be any suitable circuitry, hardware, processor-executed software or firmware, logic, etc., that operates to selectively provide dimming control values or signals to the ballast or driver 116 through the twist-lock receptacle 112 to cause the ballast or driver 116 to provide dimmable output from the light source(s) 114. The dimming component 122 is communicatively coupled to the microcontroller 125 that includes a transceiver 123 with an antenna 123a for RF communications according to one or more protocols with other RF devices 130 (e.g., external RF control devices), other RF-enabled fixtures 100, and/or with one or more RF-enabled utility meters 30. The microcontroller 125 also includes a communications interface 125a providing communications interfacing with an Internet connection bridging component 215b and/or with a CDPD modem bridging device 215a for ultimate connection with the lighting control system 202. In addition, the module 120 may include a Power Line Communication (PLC) transceiver 124 and a coupling capacitance C allowing the microcontroller 125 to communicate with other fixtures 100, meters 30, and/or a powerline bridge and router 615 via signaling connections 604 on one or both of the line power connections. Moreover, the module 120 may also include current and/or voltage measurement or sensing circuitry or components 128 and 129 for sensing input or switched power conditions for intelligent (e.g., feedback-type) dimming control.

The control module 120 in certain embodiments also includes a photo sensor 121 which senses ambient light proximate the fixture assembly 110 and provides a sensed light signal or value to the dimming component 122. The dimming component 122 selectively provides the dimming control value or values (e.g., 0-10V signal, messages, etc.) to the ballast or driver 116 in certain embodiments based at least in part on the sensed light signal or value. For example, the dimming component 122 may be programmed or otherwise configured to provide dimmed light via the dimming control value selection at dawn and/or dusk for reduced power consumption and for esthetic lighting, rather than the conventional full on/full off operation. In certain embodiments, moreover, the dimming component 122 may selectively dim the light output during certain times for energy conservation. For example, dimming unused roadways to a safe but efficient level in the middle of the night, with possible dimming control modification/override according to signals or values received from an occupancy/motion sensor 140 operatively coupled with the microcontroller 125. In certain embodiments, moreover, the dimming control component 122 may be implemented as one or more software components executed by the microcontroller 125.

In certain embodiments, the dimming component 122 is operative to selectively provide the dimming control value based at least in part on a received RF signal or value from an external RF device 130. For instance, an RF command signal can be sent to the controller module 120 wirelessly (and such signal can be sent to multiple controllers 120) for initiating dimmed, full on, full off, flashing operation, or combinations thereof by a control device 130 having an RF transmitter, thus allowing security personnel to control outdoor lighting operation. The dimming component 122 may thus provide the dimming control value(s) to control the light output according to one or more criteria, some of which may be externally actuated (e.g., via the PE sensor 121, motion sensor 140, and/or RF device 130 or combinations thereof) and some of which may be preprogrammed in the controller module 120.

Referring to FIGS. 2-5B, the system 2 may also include one or more occupancy/motion sensors 140 operatively coupled with one of the RF-enabled outdoor lighting fixtures 100 or otherwise coupled with the network 10. For instance, the controller module 120 may be operatively coupled with a motion sensor 140 (FIG. 2) to receive a wired or wireless signal (e.g., via transceiver and antennal 123, 123a). The signal from the motion sensor 140 may indicate motion or person/vehicle occupancy near fixture 110. The dimming component 122 may be operated to selectively provide the dimming control value based at least in part on a sensed motion light signal or value from the motion sensor 140. For example, the dimming component 122 may increase a dimmed power level (or go to full-on operation from a previously dimmed setting) when motion is sensed and continue this modified operation for a predetermined time or until a separate reset command is received at the controller 120. In other embodiments, the dimming control signal can be varied for output light flashing operation based at least in part on a received motion detection signal from the sensor 140.

Figure 5A:
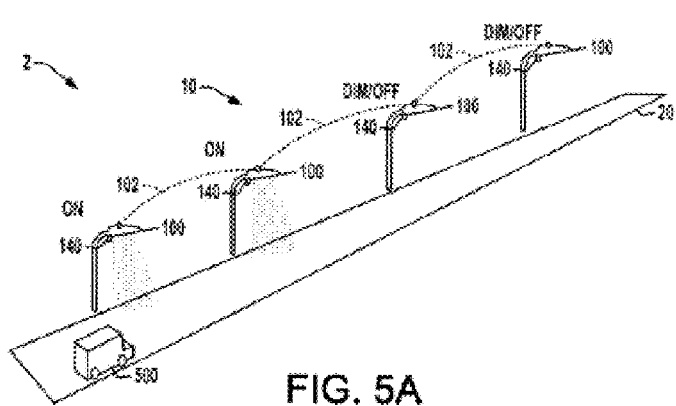
FIG. 5A is a partial system drawings illustrating use of motion/occupancy sensor(s) with reporting of sensed conditions between outdoor lighting fixtures via a lighting system network for intelligent lighting control according to one embodiment.
Figure 5B:
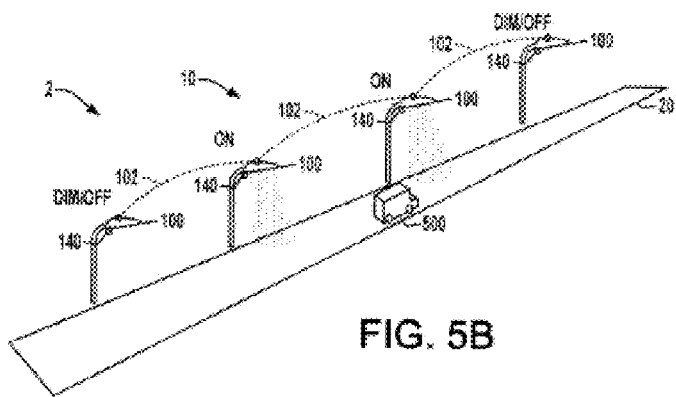
FIG. 5B is another partial system drawings illustrating use of motion/occupancy sensor(s) with reporting of sensed conditions between outdoor lighting fixtures via a lighting system network for intelligent lighting control according to one embodiment.

In the example of FIGS. 5A and 5B, the outdoor lighting fixtures 100 may notify one another of a sensed occupancy, motion signal or message received from the sensor 140 via the RF mesh network 10. A remotely controlled fixture 100 may respond by bringing the luminaire to full brightness despite a current diming setting, which may be particularly advantageous in security and safety critical applications in that it does not depend in any way on the health or current connectivity of the control system 202. For example, a sensor 140 associated with a given fixture 100 (or associated with a portion of a roadway 20 proximate a given fixture 100) can alert the fixture that a vehicle is approaching during a period of time with low expected traffic in which a dimming control scheme or profile is currently used. The notified fixture 100 can alert other fixtures 100 along the roadway for controlled overriding of the dimming control (e.g., to briefly turn their light outputs up to full lighting) while the associated portions of the roadway are occupied. As shown in the example of FIG. 5A, when a vehicle 500 approaches (and is sensed by) a first of four fixtures 100, the first fixture goes from off/dimming operation to an ON condition and notifies the next fixture 100 to do the same, while subsequent fixtures 100 remain in the off/dimmed condition. As the vehicle 500 continues down the roadway 20, signaling from a subsequent sensor 140 is relayed/reported through the mesh network 10 to cause a third fixture 100 to turn ON, while the first fixture 100 returns to the dimmed/off operation. This system thus facilitates the conservation of electric power while providing timely lighting as needed by intelligent usage of the sensors 140 and sharing of the sensed condition information within the network 10. The sensed condition(s) may be relayed to the lighting control system 202 in certain embodiments. The lighting control system 202 may be interconnected with security systems and relay sensed occupancy/motion conditions for appropriate responsive or remedial action.

Figure 6:
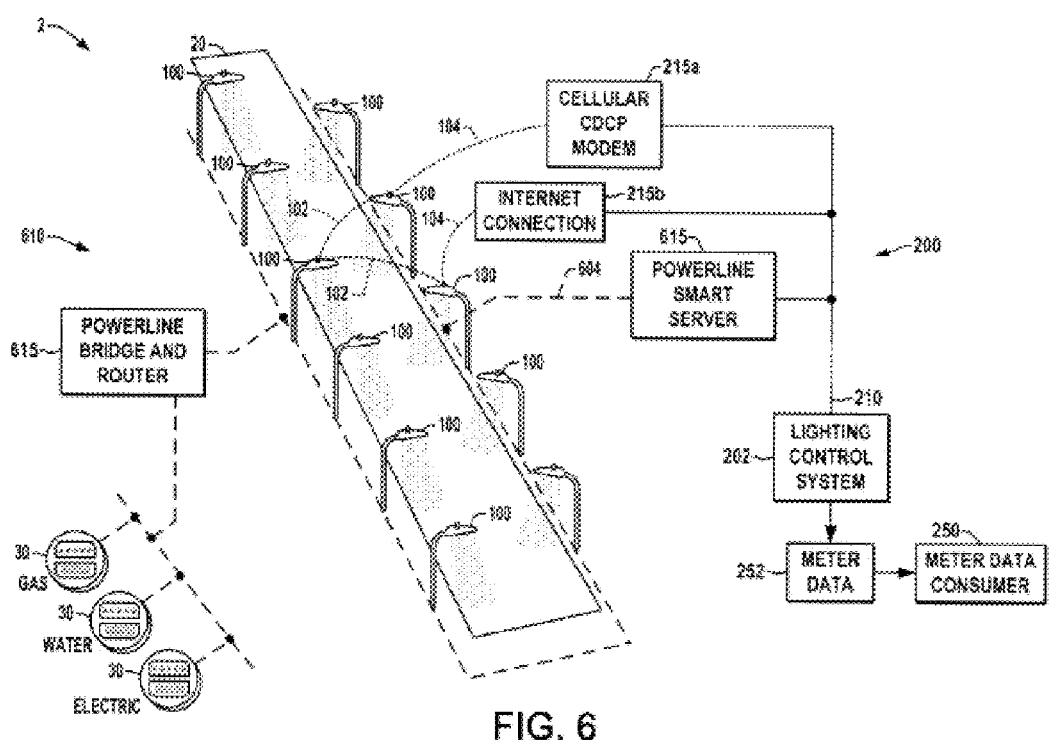
FIG. 6 is a system diagram illustrating an exemplary outdoor lighting system including Power Line Carrier (PLC)-enabled outdoor lighting fixtures according to one embodiment.

Referring also to FIG. 6, the outdoor lighting system 2 may also or alternatively include Power Line Communication (PLC)-enabled outdoor lighting fixtures 100 forming a Lighting system network 610 that is bridged with the lighting control system 202 of the general purpose network system 200. In this example, the lighting control system 202 obtains data from PLC-enabled utility meters 30 by communications through the general purpose network 210 and the lighting system network 610. The PLC-enabled outdoor lighting fixtures 100 are operative to communicate by power line signaling with at least one PLC-enabled utility meter 30 via the PLC outdoor lighting network 610, with one or more bridging components 215 and/or a powerline bridge and router 615 providing communications interfacing between the lighting network 610 and the general purpose network 210. The lighting control system 202 may operate as described above to control or monitor one or more of the PLC-enabled fixtures 100. The lighting control system 202 may also operate to obtain meter data 252 from the PLC-enabled utility meter(s) 30 by communications through the general purpose network 210, the bridging component 215, 615, and the PLC outdoor lighting network 610. The outdoor lighting network 610 in certain embodiments includes at least one RF communications connections 102 between at least two of the outdoor lighting fixtures 100 as described above, and the RF-based and PLC-based operations can be used separately or in combination in various embodiments.

In certain embodiments, a modem bridging component 215a is coupled with one or more PLC-enabled outdoor lighting fixture 100 to provide communications interfacing between the lighting network 610 and the general purpose network 210. In certain embodiments, an Internet bridging component 215b provides an Internet connection to the PLC-enabled fixture 100 to interface communications between the PLC network 610 and the general purpose network 210. In certain embodiments, the bridging component is a powerline bridge and router 615 that provides communications interfacing between the PLC outdoor lighting network 610 and the general purpose network 210. Multiple bridging components can be used in the various implementations, along with repeaters 400 (e.g., FIG. 4 above) to connect segments of a PLC/RF network 610, 10. Moreover, the PLC-enabled devices 100, 140, 615, etc. may provide multiple protocol support, for instance, with one protocol used for communicating with fixtures 100 and another used for communicating with utility meters 30. The above described occupancy sensor functionality and usage may be employed via one or more occupancy or motion sensors 140 (e.g., RF, directly connected, and/or PLC-enabled) which are operatively coupled with one of the PLC-enabled outdoor lighting fixtures 100. The lighting fixture 100 may operate to notify another fixture 100 of a sensed occupancy or motion signal or message received from the sensor 140 via the PLC outdoor lighting network 610.

Figure 7:
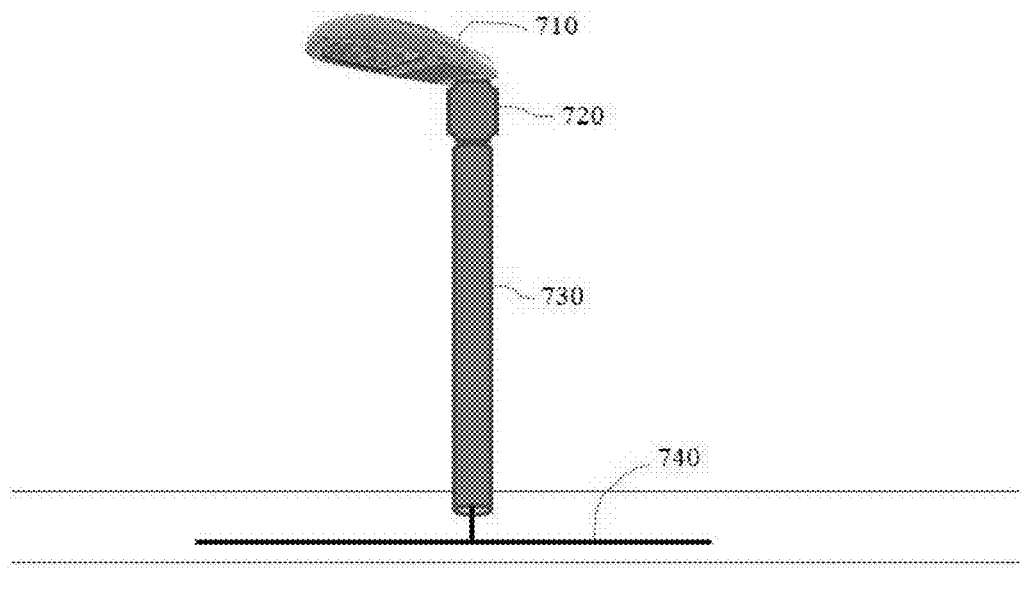
FIG. 7 is an illustration identifying the segments of a lighting fixture according to one embodiment.

In one particular, embodiment, the lighting fixtures 100 are described by segmentation into parts as illustrated in FIG. 7. The lighting fixture 100 comprises a lamp or luminaire 710, supported by a luminaire associate 720 that comprises the electronic components, electrical circuitry, and mechanical couplings associated with the mounting and control of the luminaire 710. The luminaire associate 720 is mounted atop a pole 730 that also provides a conduit for the powerline 740 serving the luminaire associate 720 and the luminaire 710.

Figure 8:
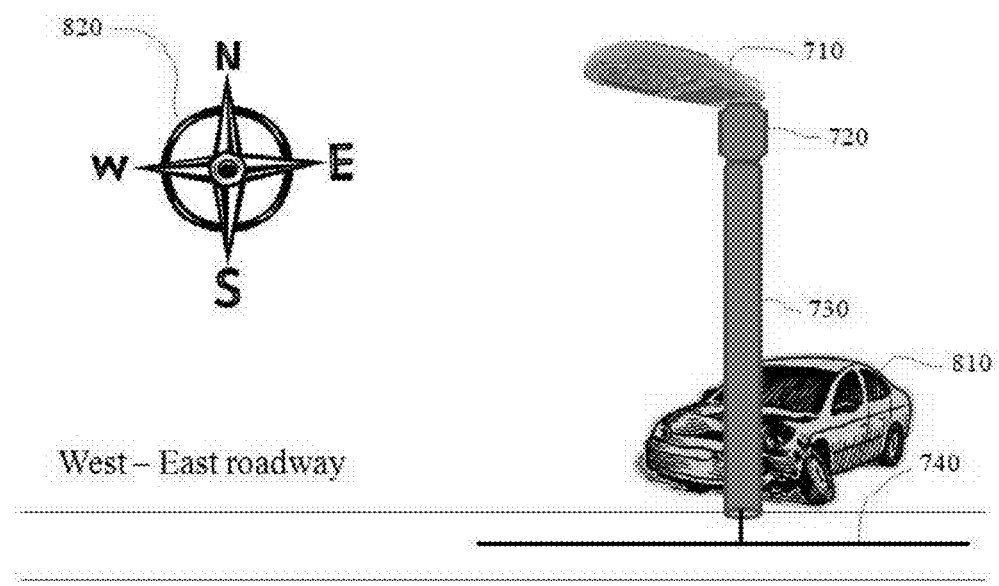
FIG. 8 is an illustration of a physical shock to a lighting fixture that caused an acceleration event according to one embodiment.

In this embodiment, the luminaire associate 720 will determine and record an acceleration event resulting from a physical shock to the luminaire associate 720. An acceleration event, as the term is used in this application, means acceleration induced by movement of the luminaire associate 720 incurred by the luminaire associate 720 experiencing a jerk or change in acceleration. Such acceleration events may include severe weather events such as earthquakes, airborne debris impacting the pole supporting the luminaire associate, projectiles, vandalism, explosions, or by a vehicle impacting the pole supporting the luminaire associate. FIG. 8 is an illustration of an errant vehicle 810 having run into pole 730 supporting luminaire associate 720. The reference compass point diagram 820 in FIG. 8 shows that the vehicle 810 was traveling in a southwestern direction when it impacted the pole 730. A two-axis accelerometer in the luminaire associate 720 are aligned such that the plane formed by the two axes is essentially parallel to the section of street below the luminaire associate. The two-axis accelerometer will sense that the jerk causing the shock to the luminaire associate 720 had a southwest direction.

Figure 9:
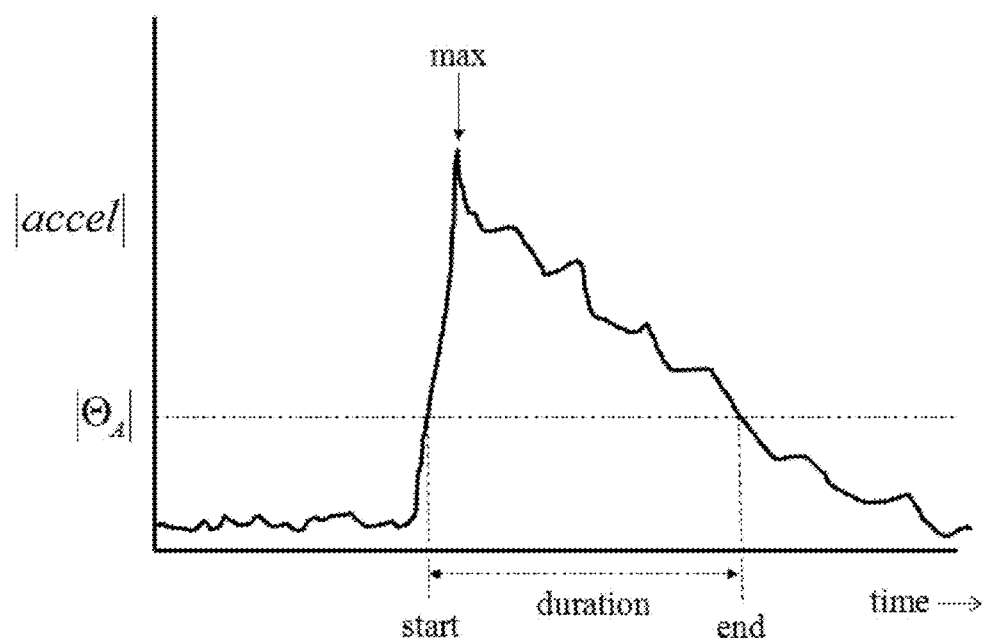
FIG. 9 is a graph representing the magnitude of horizontal acceleration plotted against time for an acceleration event according to one embodiment.

For example the illustration in FIG. 9 represents the magnitude of the horizontal acceleration as periodically sampled by a computer and plotted against time. The sampling is done of two analog-to-digital electronic converters of two axes of a multi-axis accelerometer where the two axes are orthogonal to each other and form a plane essentially parallel to the section of street below the luminaire associate device. For this example, the accelerations reported by the two axes are denoted as $A_N$ and $A_E$, respectively denoting the acceleration from the North direction and the acceleration from the East direction which in combination are referred herein as the horizontal acceleration. The magnitude of the horizontal acceleration is $|accel|=\sqrt{A_N^2+A_E^2}$. A preset threshold $|\Theta_A|$ is overlaid on the graph. If the magnitude of the horizontal acceleration exceeds the preset threshold, the start of an acceleration event is declared. When the horizontal acceleration drops below the preset threshold, the acceleration event is declared to be over. The direction angle of the jerk causing the acceleration event, $\hat{\theta}$, is estimated by computing $$\hat{\theta} = \cos^{-1}\frac{A_N}{A_E}$$

at the time, $t_{max}$, of maximum horizontal acceleration, $|accel|_{max}$.

Figure 10:
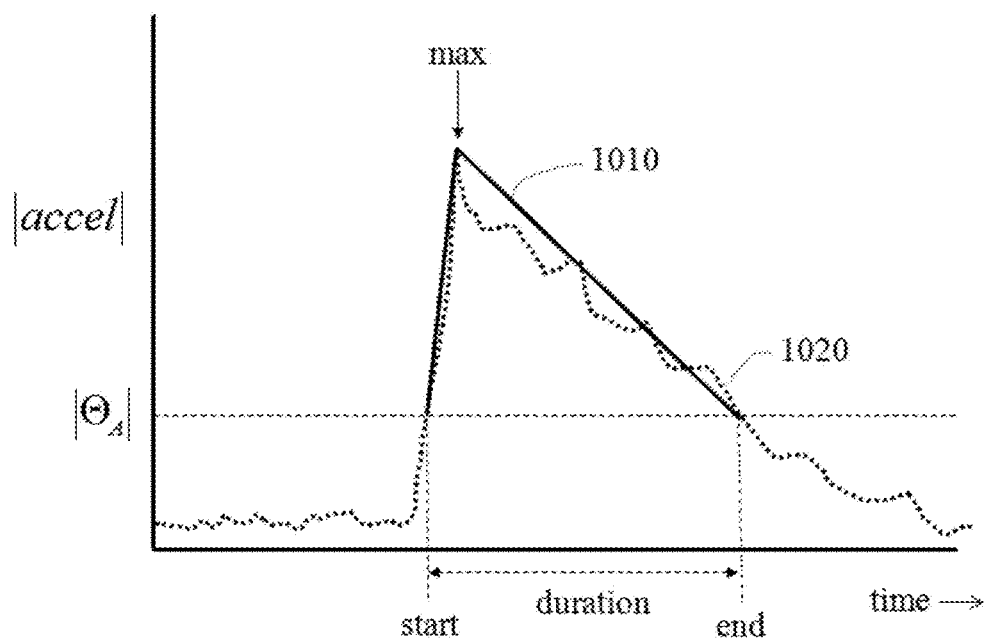
FIG. 10 is an illustration of a template fit to the magnitude of horizontal acceleration in the acceleration event depicted in FIG. 9.

The acceleration event may be summarized by detecting the beginning and ending of the acceleration event and then deriving a template that may be fitted to approximate the magnitude of the horizontal acceleration during the acceleration event. As an example, consider the illustration in FIG. 10. The $|accel|$ of FIG. 9 is plotted with a dashed line 1020 and the template includes of two joined solid line segments 1010. The leftmost of the two joined solid line segments begins at the two-dimensional point with coordinates (start, $\Theta_A$|) and terminates at the two-dimensional point ($t_{max}$, $|accel|_{max}$). The rightmost of the two joined solid line segments begins at the two-dimensional point ($t_{max}$, $|accel|_{max}$) and terminates at the two-dimensional point (end, $|\Theta_A|$). The summary of the acceleration event is its start time, its end time, and the defining elements of the template used to approximate the magnitude of the horizontal acceleration during the acceleration event.

In another embodiment, the lighting fixtures 100 are also described by segmentation into parts as illustrated in FIG. 7, the luminaire associate 720 may determine if it has been relocated. In this embodiment, an observation may be made upon installation of the luminaire associates location. The location installed luminaire associate 720 may be recorded within a lighting system's database to be at a reference geographical position, and this datum is also stored in a non-volatile computer memory in the luminaire associate 720. There is concern that for many large street lighting infrastructures, luminaire associates could be relocated by installation and maintenance crews without updating their newly located positions in the lighting system's database. The luminaire associate device may be designed to detect its spatial translation beyond a distance preset by an installer or operator. If there is a significant temporal and distance displacement of the luminaire associate 720 from its stored reference geographical position, this would indicate a physical relocation of the luminaire associate 720. Such a physical relocation may be detectable by electronically sampling and processing the multi-axis accelerometer data by doubly integrating the measured accelerations to estimate the total displacement distance of the luminaire associate from its stored reference geographical position. The integration interval may be chosen according to exclude false indications of significant distance displacement due to the integration of error drift signals in the accelerometer data. Another detection method may periodically or aperiodically compare a calculated GPS position against the reference geographical position stored within the luminaire associate. A further method is to use techniques that are well known in the art to fuse accelerometer and other available sensor data with GPS readings and make a determination that the luminaire associate has likely been relocated.

Fusing GPS data with other sensor data may require an estimate of the accuracy of the GPS data provided. Many of the luminaire associates may be located in urban canyons and incapable of generally viewing a constellation of GPS satellites that will ensure low geometric dilution of precision. For these cases it may be best to employ a GPS receiver that reports some of the components of the geometric dilution of precision including the Horizontal Dilution of Precision (HDOP) so that the data fusion algorithm will be able to properly weight the GPS data.

As an example of data fusion of GPS and accelerometer derived estimate, consider the estimated horizontal displacement derived from the accelerometer data is $\vec{d}_a$, and the variance of the estimated horizontal displacement derived from the accelerometer data is $\sigma_a^2$. The estimated horizontal displacement derived from the GPS is $\vec{d}_g$, and that the variance of the horizontal measurement accuracy using the GPS is before geometric dilution of precision. The horizontal geometric dilution of precision, HDOP, is HDOP=

$\sqrt{\sigma_E^2 + \sigma_N^2}$ where $\sigma_E^2$ and $\sigma_N^2$ are, respectively, the variances of the dilution of precision components in the orthogonal North and East directions. The variance of the horizontal measurement estimate of the GPS, $\sigma_G^2$, is thus $\sigma_G^2 = \text{HDOP}^2 \cdot \sigma_g^2$. An estimate of the true displacement's variance, $\sigma_D^2$, may be derived by fusion through weighting the noise variances of the two estimators to produce $\sigma_D^2 = 1/(\sigma_a^{-2} + \sigma_G^{-2})$. The fusion estimate of the horizontal displacement is then $\vec{D} = \sigma_D^2(\sigma_a^{-2}\vec{d}_a + \sigma_G^{-2}\vec{d}_g)$. This method of fusion would essentially discount the GPS estimate with respect to the accelerometer derived estimate if the GPS unit in the luminaire associate 720 were determined to have limited visibility to a GPS satellite constellation as may occur when the GPS unit is in an urban canyon.

Data fusion methods may also make use of data available from other sensors. Such other sensors may comprise inclinometers that measure angle of tilt and gyrometers (electronic gyroscopes) that measure angular velocity (rate of rotation). It is noted that electronic packages are commercially available that house a plurality of multi-axis sensors and host software to perform fusion upon the data from the plurality of housed sensors.

If an estimation determines that the luminaire associate has likely been relocated, then a datum indicating this may be set in non-volatile memory contained within the luminaire associate. For purposes of this application, the datum that indicates the likelihood that the luminaire associate has been relocated is referred to as the luminaire associate relocation datum or LARD.

Figure 11:
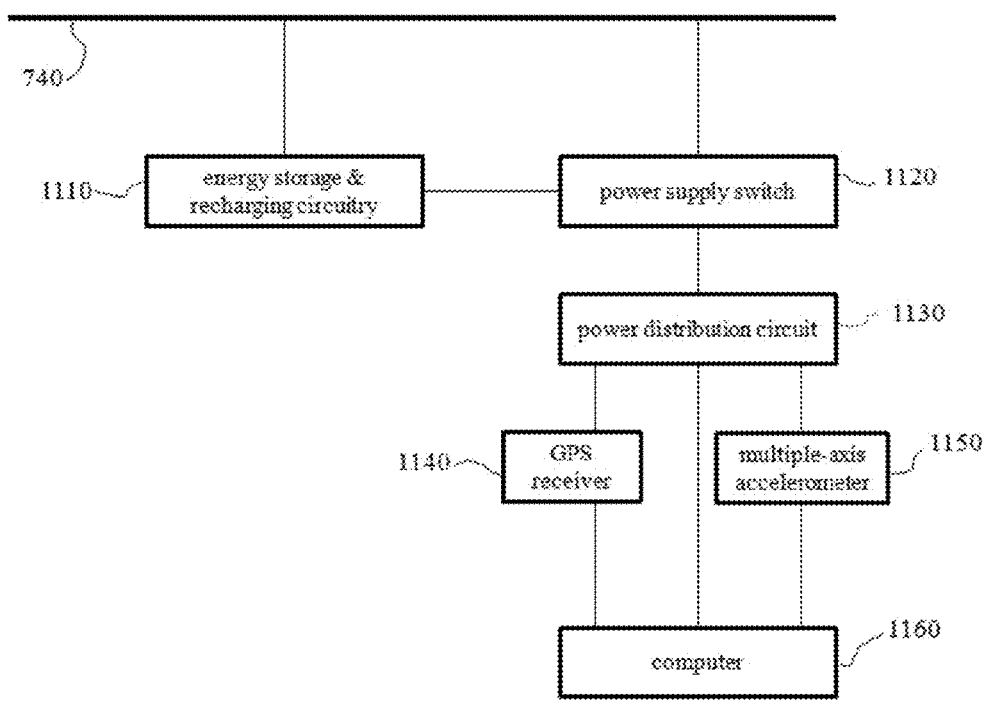
FIG. 11 illustrates the connection of components comprised in the luminaire associate according to one embodiment.

The luminaire associate 720 may comprise the components illustrated and connected as shown in FIG. 11. The luminaire associate powerline 740 is connected to a rechargeable energy storage device 1110 and its associated recharging circuitry 1110. The rechargeable energy device may be a rechargeable battery or ultracapacitor. A power supply switch 1120 is connected to both the luminaire associate powerline 740 and the rechargeable energy storage device 1110. The power supply switch 1120 may supply power to the power distribution circuit, 1130. The power supply switch 1120 may also inform the power distribution circuit, 1130, if the luminaire associate powerline 740 is energized. If the luminaire associate powerline 740 is energized, then the power distribution circuit 1130 may distribute power to a GPS receiver 1140, a multiple-axis accelerometer with electronic analog-to-digital converters 1150, and/or a computer 1160. If the luminaire associate powerline 740 is not energized, then the power distribution circuit 1130 does not distribute power to the GPS receiver 1140, the multiple-axis accelerometer with electronic analog-to-digital converter 1150, and/or the computer 1160 unless power is received from another source. In an embodiment, the power distribution circuit 1130, comprises a tilt switch or level monitor switch that candetect if the luminaire associate 720 is undergoing motion such as tilting or level changes which are likely to result from the luminaire associate's removal from its support pole 730 and its subsequent relocation. In this case, the power distribution circuit 1130 may supply power to the GPS receiver 1140, the multiple-axis accelerometer with electronic analog-to-digital converter 1150, and/or the computer 1160 for a duration preset by installation or maintenance personnel. The power distribution circuit 1130 may inform the computer 1160 that a tilt or level change has been detected that meets or exceeds preset amount and that it likely results from the luminaire associate's removal from its support pole 730. Subsequent data provided by the GPS receiver 1140 and the multiple-axes accelerometer may be fused, using sensor fusion techniques well known in the art, to provide an estimate of whether the luminaire associate 720 has been displaced beyond a distance preset by an installer or operator and the LARD is set.

Figure 12:
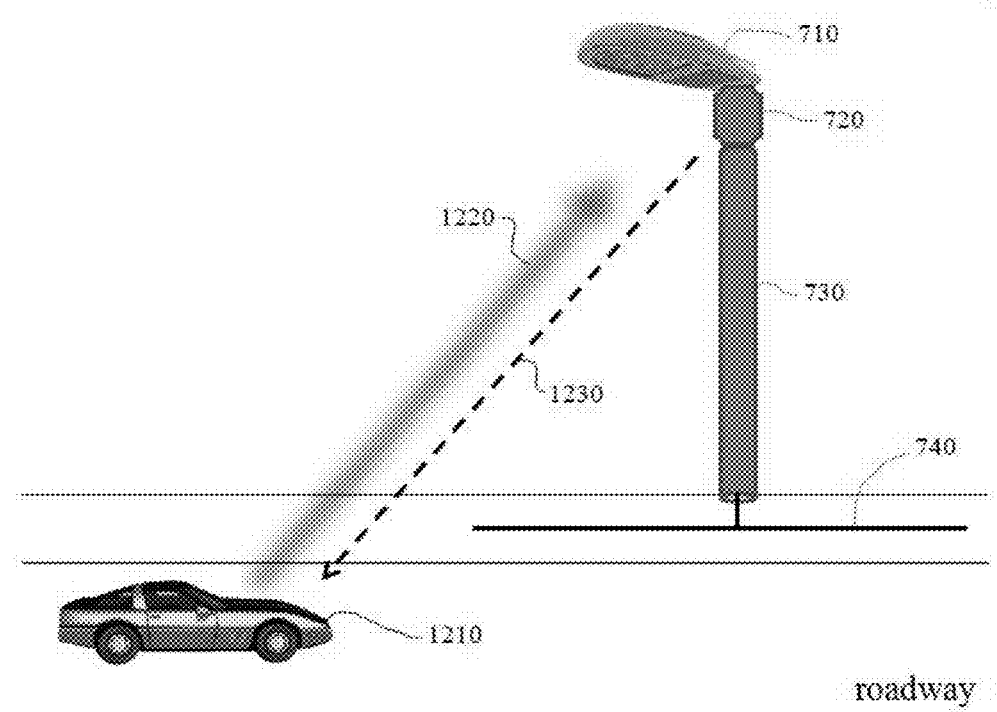
FIG. 12 illustrates a communications session between a luminaire associate and a maintenance crew according to one embodiment.

An embodiment is illustrated in FIG. 12 for detecting if the LARD is set. The luminaire associate 720 may turn on a low power wireless message transceiver and broadcast a signal 1230 indicating that the LARD is set. The low power wireless message transceiver may be fitted with an antenna whose pattern is oriented to radiate mainly towards the street below and immediately around the luminaire pole 730. As a maintenance crew in vehicle 1210 nears the pole 730, a monitoring receiver carried by the maintenance crew may be employed to detect the signal 1230 and respond to the luminaire associate 720 with signal 1220 informing the luminaire associate 720 of its new reference geographical location. The luminaire associate will then replace the its former reference geographical location with the new reference geographical location, reset the LARD, and cease broadcasting the signal 1230.

The above examples are merely illustrative of several possible embodiments of the various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been illustrated and/or described with respect to only one of several implementations, such feature may be combined with one or more other features of the other implementations as may be desired and advantageous for any given or particular application. Furthermore, references to singular components or items are intended, unless otherwise specified, to encompass two or more such components or items. Also, to the extent that the terms "including", "includes", "having", "has", "with", or variants thereof are used in the detailed description and/or in the claims, such terms are intended to be inclusive in a manner similar to the term "comprising". The invention has been described with reference to the preferred embodiments. Modifications and alterations will occur to others upon reading and understanding the preceding detailed description. It is intended that the invention be construed as including all such modifications and alterations.

The invention claimed is:

1. A method for detecting a luminaire associate relocation position from stored reference geographical position comprising the steps of:
   deriving an estimated geographical position for the luminaire associate from a GPS receiver contained within the luminaire associate;
   deriving an estimate of lateral displacement by electronically sampling and processing data from a multi-axis accelerometer contained within the luminaire associate, wherein the data from the multiple-axis accelerometer comprises estimates of a spatial translation of the luminaire associate;

combining the estimated geographical position and the estimated lateral displacement using a sensor fusion algorithm to form a single estimate of spatial translation;

comparing the single estimate of spatial translation to a preset threshold of spatial translation;

setting a luminaire associate relocation datum (LARD) if the single estimate of spatial translation exceeds the preset threshold of spatial translation.

2. The method of claim 1 further comprising the step of broadcasting a signal that the LARD is set.

3. The method of claim 2 further comprising the steps of:

receiving a signal conveying a new stored reference geographical position for the luminaire associate;

replacing the stored reference geographical position with the new stored reference geographical position;

resetting the LARD; and ceasing broadcast of the signal that the LARD is set.

* * * * *